United States Patent [19]

Saban

[11] 4,421,368

[45] Dec. 20, 1983

[54] LEAD-RECEIVING SOCKET, MULTI-SOCKET ASSEMBLY INCORPORATING SAME AND METHOD OF EFFECTING CIRCUIT INTERCONNECTIONS THEREWITH

[75] Inventor: John F. Saban, Lyons, Ill.

[73] Assignee: Western Electric Company, Inc., New York, N.Y.

[21] Appl. No.: 289,019

[22] Filed: Jul. 31, 1981

[51] Int. Cl.[3] ............................................. H01R 13/28
[52] U.S. Cl. ............................. 339/17 CF; 339/275 B
[58] Field of Search ........... 339/17 CF, 275 R, 275 B, 339/275 T, 278 C

[56] References Cited

U.S. PATENT DOCUMENTS

| | | | |
|---|---|---|---|
| 3,519,982 | 7/1970 | White, Jr. ........................... | 339/275 T |
| 3,634,879 | 1/1972 | Longenecker ................... | 339/17 CF |
| 3,721,941 | 3/1973 | Wisser ............................ | 339/17 CF |
| 3,975,079 | 8/1976 | Blakesley et al. ................ | 339/278 C |
| 4,025,148 | 5/1977 | Bouley ............................ | 339/17 CF |
| 4,045,105 | 8/1977 | Lee et al. ........................ | 339/17 CF |
| 4,183,611 | 1/1980 | Casciotti ......................... | 339/275 B |

FOREIGN PATENT DOCUMENTS 2803813  8/1979  Fed. Rep. of Germany ... 339/175 T

OTHER PUBLICATIONS

Robinson Nugent Inc., Data Sheet for Pin Socket ICT Series.
Electronic Molding Corp., Data Sheet for Nur-l-Lock ® Pin Socket.

Primary Examiner—Joseph H. McGlynn
Attorney, Agent, or Firm—K. R. Bergum; R. P. Miller; H. St. Julian

[57] ABSTRACT

An auxiliary multi-socket assembly (25) is employed to function as a releasable interconnecting interface between a multi-leaded circuit module (30), preferably solder-connected to the auxiliary socket assembly, and a primary socket assembly (43) of conventional design, generally solder-connected to a common support member, such as a circuit board (41).

6 Claims, 9 Drawing Figures

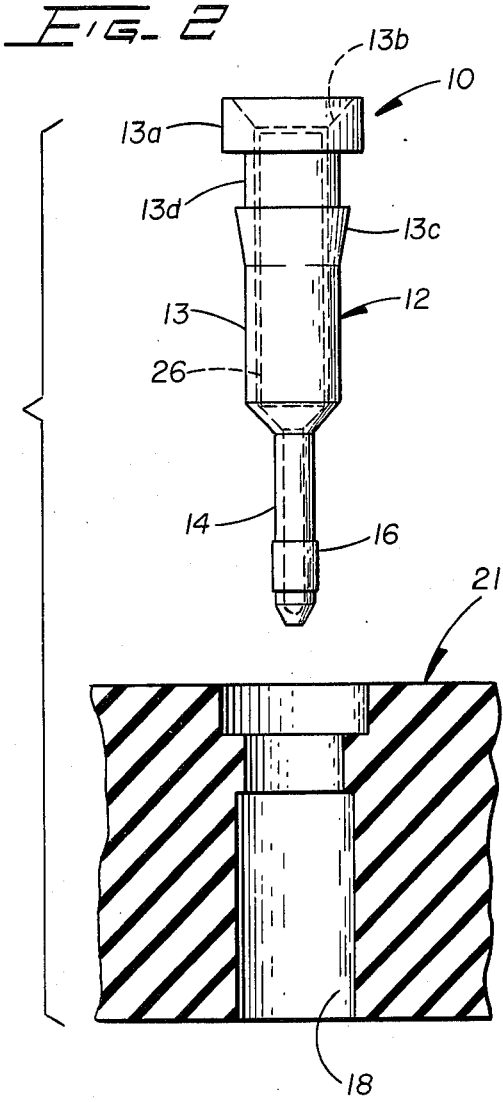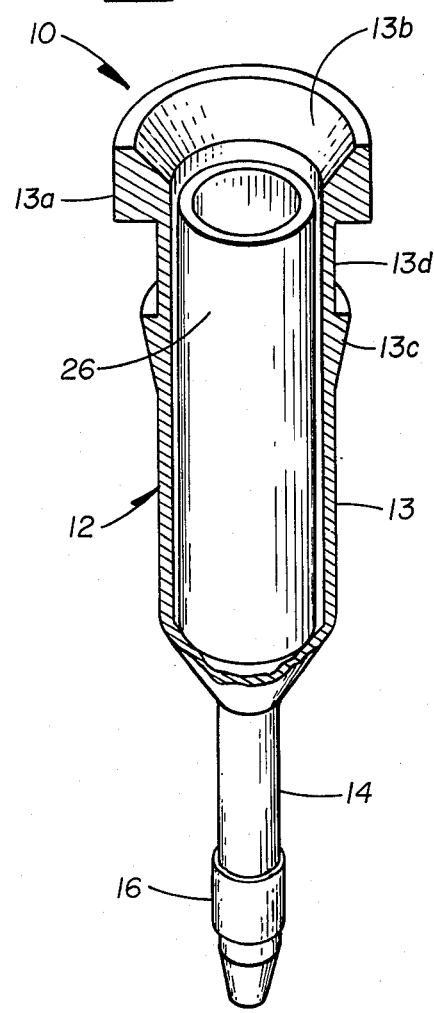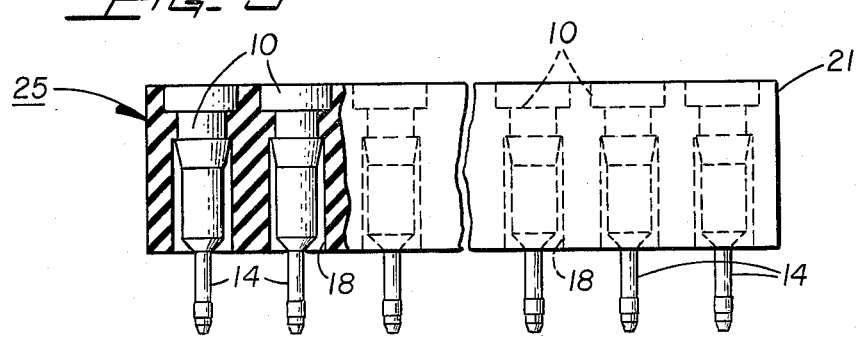

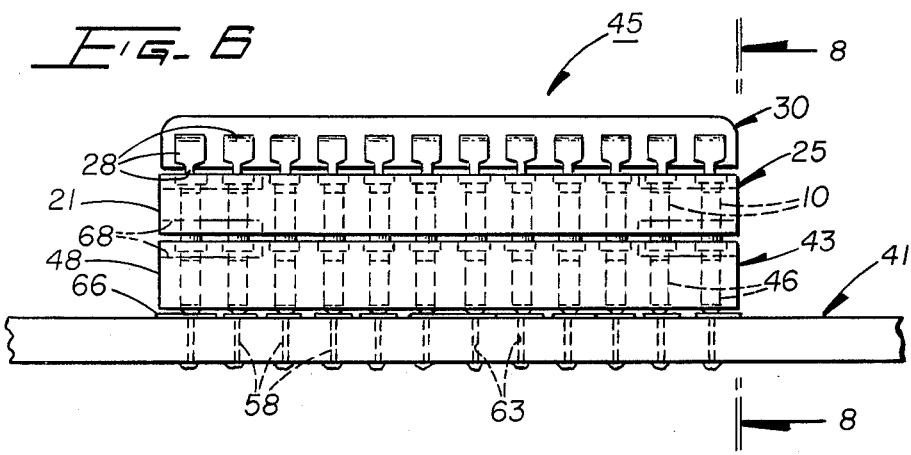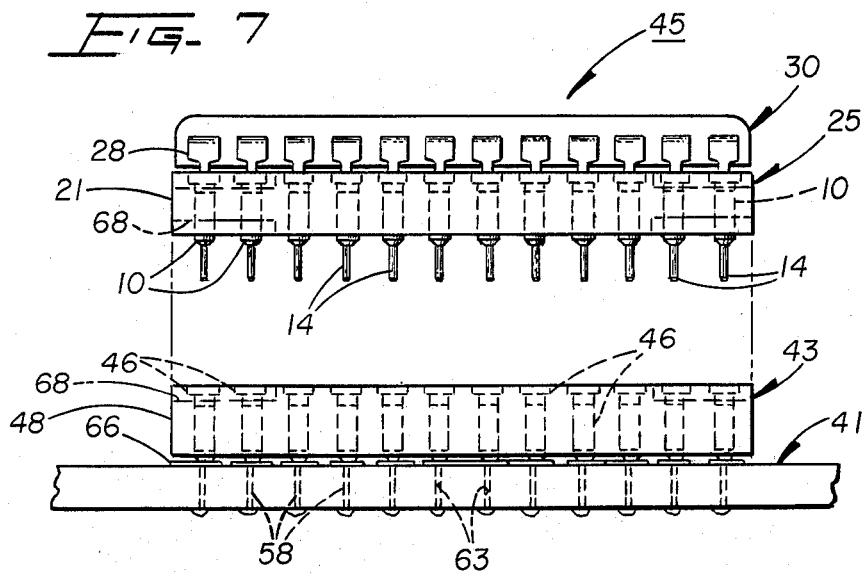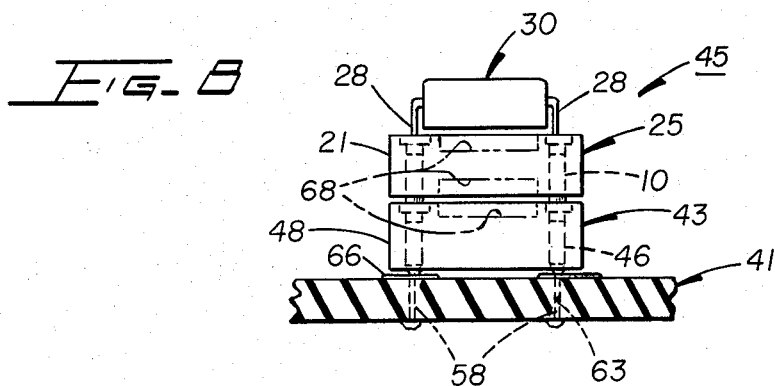

LEAD-RECEIVING SOCKET, MULTI-SOCKET ASSEMBLY INCORPORATING SAME AND METHOD OF EFFECTING CIRCUIT INTERCONNECTIONS THEREWITH

FIELD OF THE INVENTION

This invention relates to lead-receiving sockets and, more particularly, to such sockets incorporated in a non-conductive block to form an auxiliary multi-socket assembly, with the latter being adapted to function as an interface to releasably and indirectly connect the leads of a multi-leaded circuit module to an associated support member, such as a circuit board, via an intermediate primary socket assembly permanently secured to the circuit board.

BACKGROUND OF THE INVENTION

In the assembly and repair of complex circuit modules typically having dual-in-line leads that extend downwardly therefrom, considerable care must normally be taken during the insertion of the leads into, or their extraction out of, an associated multi-socket assembly so as to neither damage the leads nor the body portion of the circuit module. A particularly serious problem has arisen in this regard with respect to circuit modules of the hybrid integrated circuit type, often employing thin film circuitry fabricated on a relatively thin, fragile circuit-supporting substrate, such as of ceramic material.

Whenever multi-leaded circuit modules of any particular type have been releasably connected, (as distinguished from soldered) to an associated circuit board via a multi-socket assembly heretofore, reliable lead-socket engagement has required that the leads, as well as the internal socket contacts, must be at least selectively gold plated. However, having to gold plate the leads of a circuit module substantially increases not only the manufacturing costs thereof, but inventory costs.

There has thus been an urgent need for a technique whereby the leads of multi-leaded circuit modules need not be gold plated in order to allow effective, reliable and readily releasable connections to be made between such leads and associated circuitry fabricated on a common support member, such as a circuit board. There has also been a need for a technique to extract the leads of a circuit module having a fragile circuit-supporting substrate from a circuit board without requiring the exertion of any direct displacement forces on either the substrate or the circuit board. In this connection, it is appreciated that a high density circuit board, in particular, may often also have easily damaged circuitry either supported or fabricated thereon in the immediate vicinity of a given circuit module to be extracted.

SUMMARY OF THE INVENTION

In accordance with the principles of the present invention, a low profile lead-receiving socket, having a unique pre-formed solder insert confined therewithin, is incorporated in an auxiliary multi-socket assembly employed to function as an interface to releasably interconnect a multi-leaded circuit module with a common support member, such as a circuit board, through a primary socket assembly of conventional design, the latter generally being solder-connected to the circuit board.

The auxiliary socket assembly is comprised of an array of discrete low profile sockets supported within a plastic block, with each socket including an outer conductive shell having an upper tubular portion within which a preformed solder insert, preferably of tubular configuration, is confined, and having a lower portion formed into a male-type pin with a selective plating of gold thereon. The tubular solder insert is dimensioned to allow a circuit module lead to be initially zero-force-inserted axially therewithin.

The lower socket pin is adapted to be releasably received within an upper gold plated female portion of an aligned primary socket which, as previously noted, may be of conventional design. Each primary socket, which forms part of a primary socket assembly, also has a lower pin portion which is unplated and adapted to be inserted through an aligned hole of an associated circuit board, and soldered to a printed circuit formed thereon.

With the auxiliary socket assembly thus constructed, and employed in conjunction with a primary socket assembly, it is seen that a multi-leaded circuit module advantageously does not have to be gold plated in order to be releasably secured to the circuitry of an associated circuit board, as a result of the gold-to-gold (male-female) solderless connections established between the primary and secondary socket assemblies.

The auxiliary socket assembly also significantly allows a fragile multi-leaded circuit module to be readily extracted from the otherwise normally directly connected primary socket assembly by simply effecting relative displacement forces between only the non-conductive blocks of the mating primary and auxiliary socket assemblies, such as through the use of a wheel puller type of extraction tool. One such tool is disclosed in J. S. Hannes-R. B. Harringer co-pending application, Ser. No. 268,612, filed June 1, 1981, and assigned to the same assignee as the present invention.

In this connection, the pin portions of the sockets in the auxiliary socket assembly may further be formed with stand-off shoulders, or alternatively, peripherally spaced notches may be formed in the non-conductive block of either the primary or secondary socket assemblies, or both, in the area of the interface defined therebetween, so as to facilitate a circuit module extraction operation. The use of strategically located notches may also be employed to facilitate the dissipation of heat.

In accordance with a second preferred embodiment of the socket employed in an auxiliary socket assembly, the solder insert is substantially of spherical configuration, and confined within the base region of the upper female portion of the outer socket shell. Such a solder insert affords the same basic advantages as described above in connection with the tubular solder insert, albeit the spherical insert would not normally provide the same degree of axially directed solder contact between a nested lead and the inner wall of the socket shell.

BRIEF DESCRIPTION OF THE DRAWINGS

FIG. 1 is an enlarged perspective view, partially broken away, of a low profile lead-receiving socket, including a pre-formed tubular solder insert confined within an upper female portion of the outer socket shell, embodying the principles of the present invention;

FIG. 2 is a fragmentary exploded view, partially in section, and with certain internal structural lines shown in phantom, of the lead-receiving socket of FIG. 1 in relation to, and as adapted for support within, a non-conductive block, with a plurality of such block-supported sockets forming an auxiliary socket assembly in accordance with the principles of the present invention;

FIG. 3 is a front elevational view, partially in both section and phantom line form, of a composite auxiliary multi-socket assembly incorporating sockets of the type depicted in FIGS. 1 and 2;

FIG. 6 is a front elevational view, with certain internal structural lines shown in phantom, of the composite circuit package illustrated in fragmentary cross-sectional view in FIG. 4;

FIG. 7 is a front elevational view distinguishing over that of FIG. 6 by illustrating how the auxilary socket assembly embodying the principles of the present invention, as solder-connected to an associated multi-leaded circuit module, is readily separated from an associated primary socket assembly, and a circuit board solder-connected thereto; FIG. 8 is an elevational end view of the composite circuit package of FIG. 6, taken along the line 8—8 of FIG. 6, showing in greater detail the positions of selected notches formed in one or optionally in both non-conductive blocks of the primary and auxiliary socket assemblies so as to facilitate the separation of the auxiliary socket assembly from the primary socket assembly through the use of any suitable conventional extraction tool.

DETAILED DESCRIPTION OF THE INVENTION

Figure 4:
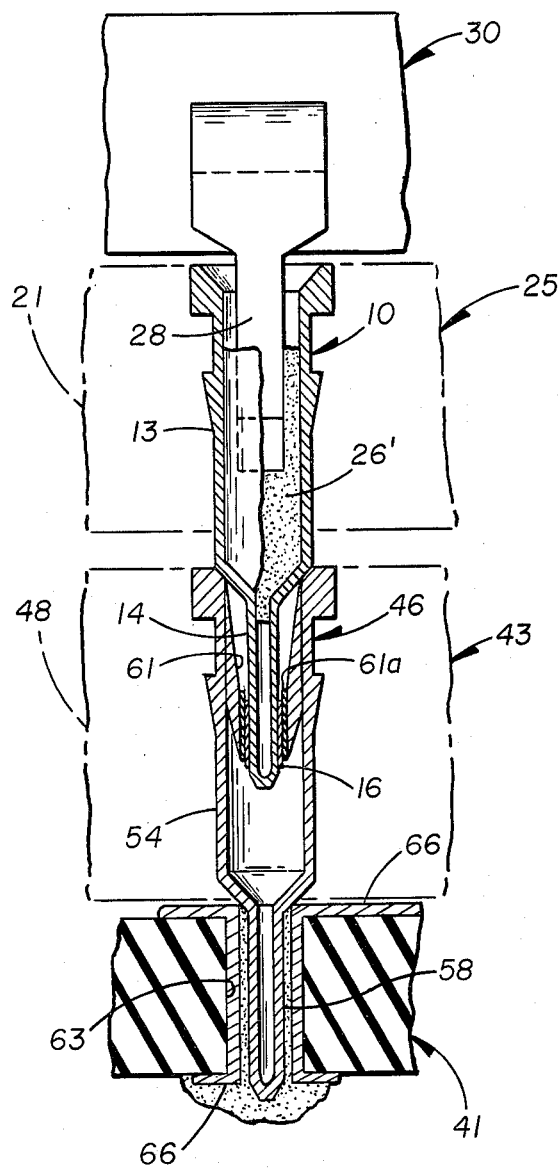
FIG. 4 is an enlarged, fragmentary cross-sectional view of a composite circuit package incorporating one preferred embodiment of the auxiliary multi-socket assembly depicted in FIGS. 1 and 2.

It should be appreciated that while the invention is described in detail herein primarily for use in interconnecting a generally described multi-leaded circuit module to a common support member, such as a circuit board, it should be understood that such a general reference to a "circuit module" is intended to embrace conventional dual-in-line packages (DIPS), flat packs, circuit packs, circuit cards or chip carriers, as well as otherwise broadly defined multi-leaded electronic components, devices or assemblies.

With particular reference first to FIGS. 1 and 2, there is illustrated what is referred to hereinafter as an auxiliary or "daughter" socket 10 embodying features of one preferred embodiment of the invention. The socket is constructed with an outer cylindrical shell 12 having an upper tubular female portion 13 of larger diameter than a lower male pin portion 14. As configured, the shell 12 may either be formed out of solid rod rock, suitably drilled and surface contoured, or die-formed out of strip stock, in either case in a conventional manner. The socket shell is preferably made out of brass, phosphur-bronze or berylium-copper, with the pin portion 14 typically having a thin layer 16 of gold or gold-over-nickel plated on at least a selected terminating end region thereof.

The upper end of the female shell portion 13 is formed with a collar portion 13a that includes a beveled surface 13b which facilitates the guiding of a circuit module lead within the socket. The outer wall of the female shell portion 13 is also preferably formed with an upwardly and outwardly protruding section 13c, terminating in an undercut circumferentially disposed recess 13d, which together cooperate with the collar portion 13a to effect the snap-action locking of the socket 10 within an associated cooperatively contoured hole 18 pre-formed in a non-conductive block 21. Such a block may be formed out of a number of different types of material, such as of glass-filled polyester, or of Ryton ® plastic material (a registered trademark of the Phillip's Petroleum Company, Inc.).

As will be described in greater detail hereinbelow, the block 21 is illustrated in FIGS. 3 and 8 as supporting two in-line arrays of sockets 10 to form a composite multi-socket assembly 25. The sockets, of course, could be arranged in any other number of rows, or in specialized patterned arrays, in accordance with a given interconnecting circuit application. It should also be understood that the outer wall of the upper female shell portion 13 of each socket, as well as the wall of each pre-formed hole 18 in the block 21, could be configured in many other ways to form suitably positioned ridges, shoulders, recesses or detents to effect the desired type of snap-in locking action therebetween. Alternatively, the sockets 10, if desired, could also be permanently secured within the block 21 as a result of the latter being molded about a pre-positioned array of the sockets.

In accordance with an aspect of the present invention, the upper socket shell portion 13 is adapted to receive a pre-formed lead-receiving tubular solder insert 26 therewithin (best seen in FIG. 1). The solder insert is preferably formed out of low temperature tin-lead eutectic solder, with an outside diameter that allows the force-fit insertion thereof within the cylindrical female portion 13 of the socket shell. The diameter of the solder insert, at least after assembly within the socket shell, is chosen to allow a lead 28 of a multi-leaded circuit module 30 (see FIG. 4) to be received therewithin with essentially only zero-insertion force, prior to effecting the soldering of the lead to the socket.

In a typical interconnecting circuit application, upon the circuit module leads 28 of the circuit module 30 having been simultaneously inserted into the respectively aligned sockets of the auxiliary socket assembly 25, soldered connections may be readily effected simultaneously in a suitable fixture (not shown), such as by utilizing a conventional Joulian resistance heating technique. The latter technique could be readily implemented by utilizing separate heating elements (not shown) to individually heat the exposed socket pin portions 14 to a temperature sufficient to effect the melting of the solder inserts 26 about the respectively associated circuit module leads and, thus, simultaneously establish reliable soldered socket-lead connections.

One such soldered connection is shown in detail in FIG. 4, wherein it is seen that the resultant solidified solder 26' substantially fills the interstices defined between the inner wall of the socket shell portion 13 and the nested circuit module lead 28 along at least substantial, coextensive axial lengths thereof. In most interconnecting circuit applications, the inner diameter of the male pin portion 14 of the shell would be so small as to prevent any appreciable amount of molten solder to gravitate into the upper region thereof.

It should also be understood, of course, that the preformed tubular solder inserts 26 could be melted in accordance with any one of a number of alternative and conventional conduction, convection or radiation heating techniques, including among those the more specialized forms involving eddy currents, ultrasonic energy, or the latent heat of vapor condensation.

With the non-gold plated leads 28 of the illustrative circuit module 30 having been reliably soldered to the sockets 10 of the composite auxiliary socket assembly 25, that interconnected combination of elements, as best seen in the exploded view of FIG. 7, may be readily interconnected in a solderless manner to a printed circuit board 41 via a primary socket assembly 43 of conventional design to form a composite circuit package designated generally by the reference numeral 45. Such an interconnected circuit package is established, in accordance with the principles of the present invention, by inserting the downwardly extending, gold-plated pin portions 14 of the auxiliary socket assembly 25 into the respectively aligned ones of a dual-in-line array of primary sockets 46, supported within a plastic block 48, which together form the primary socket assembly 43.

Figure 5:
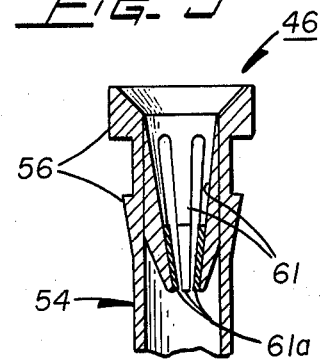
FIG. 5 is a fragmentary sectional view of the upper portion of a conventional socket incorporated in a primary socket assembly which forms part of the composite circuit package depicted in FIGS. 4 and 6.

The primary sockets 46 which, as previously noted, may be of conventional construction, may be purchased from a number of suppliers, one being the Robinson-Nugent Company, Incorporated. By way of example only, a fragmentary portion of one such primary socket is shown in greater detail in FIG. 5, and typically includes a die-formed or rod-drilled outer shell 54, such as of brass, formed with an upper tubular female portion 56 and with a lower male-type pin portion 58 (seen only in FIGS. 4, and 6–8). As distinguished from the socket 10 embodied herein, the socket 46 includes an axially slotted or fluted insert 61, secured within the upper female portion 56 of the socket shell 54, so as to provide a circumferentially disposed array of spring-biased finger or contact portions 61a that are gold plated to effect reliable gold-to-gold frictional contact with a circuit module lead 28 when nested within the insert. The downwardly extending male-type terminal or pin portion 58 of the outer shell 54 of each primary socket 46 need not be gold plated, as it is intended to be solder-connected to the circuit board 41. This is most readily accomplished by initially inserting the pin portions 58 of the primary sockets through respectively aligned holes 63 formed in the circuit board and, thereafter, simultaneously soldering the leads to discrete circuit sites, or land areas 66, formed on the underside and/or top side of the circuit board, such as through the use of conventional wave soldering apparatus.

As best seen in FIGS. 4 and 8, the sockets 10 in the auxiliary socket assembly 25 are shown supported in the associated block 21 such that a lower region of the female portion 13 of each socket outer shell protrudes a predetermined distance beneath the lower surface of the support block. Such protruding portions function as stand-offs to space the auxiliary and primary socket assembly blocks sufficiently to allow an extraction tool to be readily inserted therebetween and effect the separation of the two socket assemblies. The same result could be achieved, of course, by forming the pin portions 14 of the sockets 10 with suitably positioned stand-off shoulders (not shown), if desired, in a given application.

By utilizing an extraction tool of the wheel puller type, such as disclosed in the aforementioned Hannes et al. co-pending application, very uniformly distributed displacement forces may be exerted against only the peripheral edge regions of the auxiliary and primary socket assemblies. This insures that even a very fragile circuit module 30 may be extracted from the primary socket assembly 43 with no possible damage to the former, such as involving the chipping or cracking of the body portion, or the bending of the leads thereof. In applications where space requirements, for example, may necessitate that the lower surface of the auxiliary socket assembly block 21 abut against the primary socket assembly block 48, opposite side undercut notches 68 (see FIGS. 6 and 8) may be optionally formed in either block, or in both blocks. Such notches would allow an extraction tool to grip the underside of the block 21 and, thus, effect the extraction of the solder-connected auxiliary socket assembly 25 and circuit module 30 from the primary socket assembly 43. The notches 68 are shown in dashed-line form in FIG. 8 to indicate that they are optional. When suitably dimensioned and spaced, such notches would not only facilitate the use of extraction tools to separate the two socket assemblies, but would further facilitate the dissipation of any heat generated by the associated socket-connected devices or circuitry.

It should also be appreciated that when very low profile sockets are employed in both the auxiliary and primary socket assemblies, and when there is no spacing therebetween, as assembled, the total height of a composite circuit package 45, typically comprised of the multi-leaded circuit module 30, auxiliary socket assembly 25, primary socket assembly 43, and circuit board 41, as depicted in FIGS. 6 and 8, need not be appreciably greater than that normally involved when utilizing only a primary socket assembly of conventional design.

Figure 9:
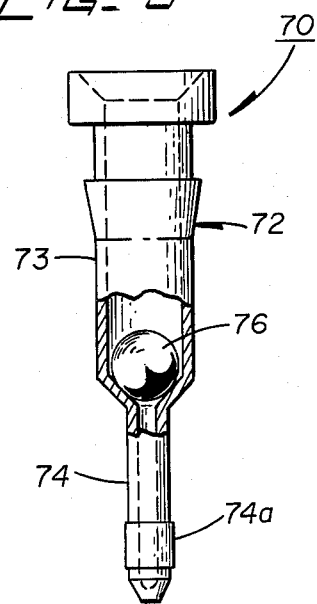
FIG. 9 is an elevational view, partially in section, and with certain internal structural lines shown in phantom, of a second preferred auxiliary socket basically identical to the socket of FIG. 1, but distinguishing therefrom by incorporating a pre-formed solder insert of spherical configuration within an upper female portion of the outer socket shell, and being adapted for support within a non-conductive block, as illustrated in FIGS. 2–4, to also form an auxiliary multi-socket assembly embodying the principles of the present invention.

FIG. 9 illustrates a second preferred embodiment of the invention wherein a socket 70 is comprised of a conductive shell 72 that includes an upper female portion 73, and a lower male portion 74 having a selective plating 74a of gold thereon. Such a socket 70 may be identical to the socket 10 of FIG. 1. The socket 70 distinguishes over the socket 10, however, by having a pre-formed solder insert 76 of substantially spherical, rather than tubular, configuration confined within the base region of the female portion thereof, as fabricated. Such a solder insert advantageously provides the same basic advantages as described above in connection with the tubular solder insert 26.

It will be appreciated, however, that a spherical solder insert would normally not provide the same degree of axially directed soldered contact between a nested lead (not shown) and the co-extensive inner wall of the upper female portion of the socket shell as would be realized with a tubular solder insert. This would most likely be the case when a given tubular solder insert is formed with a length substantially greater than its diameter. In all other respects, however, the socket 70, as previously noted, is identical to the socket 10 in FIG. 1, and advantageously provides the same basic advantages when used in a multi-socket assembly.

In summary, it is seen that by utilizing an auxiliary socket assembly 25 constructed in the manner described herein, a multi-leaded circuit module 30 may be readily interconnected in a solderless manner to associated circuitry on a common circuit board 41 through the releasably established gold-to-gold (male-female) interfaces established between the pin portions 14 of the auxiliary sockets 10 (or 70) and the insert contacts 61a of the respectively associated primary sockets 46. As such, the leads 28 of a circuit model 30 advantageously do not have to be gold plated, as fabricated, or as maintained in inventory.

In this connection, it should also be appreciated that the auxiliary sockets 10 (or 70) normally would require less gold on the lower male-type pin portions 14 thereof than when plated on the circuit module leads 28, because such plating on the former can be more precisely controlled and selectively positioned. Compounding the problem of gold usage when circuit module leads have been plated heretofore has been the fact that they are often of different lengths for different codes or types of circuit modules, either as manufactured or used. The resulting savings in gold has thus been found to substantially offset the costs involved in using an auxiliary socket assembly 25, with the many attendant advantages derived therewith as pointed out hereinabove.

While two preferred lead-receiving sockets, and related socket assembly embodiments employing such sockets have been disclosed herein, as well as a composite circuit package and a method involving the interconnection of a multi-leaded circuit module to a circuit board of such a circuit package, through the use of an auxiliary socket assembly releasably connected to a primary socket assembly, it is obvious that various modifications may be made to the present illustrative claimed embodiments and methods of the invention, and that a number of alternative related embodiments and methods could be devised by one skilled in the art without departing from the spirit and scope of the invention.

What is claimed is:

1. An interconnected composite circuit package comprising:
    a multi-leaded circuit module having a plurality of leads extending therefrom;
    a circuit board having a plurality of pre-formed holes therein and associated circuitry formed on one surface thereof;
    at least one primary socket assembly including at least one predetermined array of primary sockets permanently secured to said circuit board, each of said primary sockets having an upper female portion with internally confined precious metal contacts adapted to receive and releasably electrically engage an associated male-type pin, and further having a lower terminal portion adapted to be received within one of said plurality of preformed holes and soldered to said associated circuitry on said circuit board, and
    at least one auxiliary multi-socket assembly interposed between said circuit module and said primary socket assembly, said auxiliary socket assembly including a non-conductive block, and a plurality of low profile circuit-module lead-receiving auxiliary sockets supported by, and extending through, said block in at least one predetermined spaced array corresponding to the array of sockets in said primary socket assembly, each of said auxiliary sockets comprising a conductive shell having an upper female portion of sufficient inside cross-section to receive both a pre-formed solder insert and one of said circuit module leads therewithin, and further having a lower male-type pin portion, with at least a selected area therealong being precious metal plated so as to be releasably received within, and to establish precious metal-to-precious metal contact with, said contacts confined within said female portion of an aligned one of said primary sockets, said pre-formed solder insert in each of said auxiliary sockets being adapted, upon subsequently being heated to a molten state and then allowed to re-solidify, after an aligned circuit module lead has been nested therein, to fill the interstices between the inner wall of the female portion of said associated socket shell and such a nested lead, along at least substantial, co-extensive axial lengths thereof.

2. An interconnected composite circuit package in accordance with claim 1 wherein each solder insert is initially of tubular configuration, and dimensioned to be confined in close-fit relationship with the inner wall of said upper female portion of the associated socket shell.

3. An interconnected composite circuit package in accordance with claim 2 further including at least two mutually disposed notches formed in the underside of said nonconductive block, said notches communicating with the outer periphery thereof so as to selectively facilitate the separation of said auxiliary socket assembly from said normally interconnected primary socket assembly, and the dissipation of heat therebetween.

4. An interconnected composite circuit package in accordance with claim 1 wherein each solder insert is initially at least substantially of spherical configuration, and dimensioned to be confined within the base region of said upper female portion of the associated socket shell.

5. An interconnected composite circuit package in accordance with claim 4 further including at least two mutually disposed notches formed in the underside of said nonconductive block, said notches communicating with the outer periphery thereof so as to selectively facilitate the separation of said auxiliary socket assembly from said normally interconnected primary socket assembly, and the dissipation of heat therebetween.

6. A multi-socket assembly for mounting a circuit module with an array of dual-in-line leads on a circuit board with an array of holes corresponding to the array of dual-in-line leads, which comprises:
    a first array of sockets having female portions with selected areas thereof plated with gold and male portions projecting into and secured within the array of holes in the circuit board;
    a first rigid block of non-conductive material surrounding and supporting said first array of sockets;
    a second of array of sockets corresponding to the array of dual-in-line leads and the first array of sockets having female portions for receiving the array of dual-in-line leads and having male portions plugable into the female portions of the first array of sockets; said male portions having selected areas plated with gold corresponding in size with the gold platings on the female portions of the first array of sockets and mateable therewith upon plugging of the male portions of said second array of sockets into the female portions of said first array of sockets;
    means within said female portions of said second array of sockets for bonding the dual-in-line leads within said female portions of said second array of sockets; and
    a second rigid block of non-conductive material surrounding and supporting said second array of sockets.

* * * * *